US012354817B2

(12) United States Patent
Schremmer et al.

(10) Patent No.: US 12,354,817 B2
(45) Date of Patent: Jul. 8, 2025

(54) SHORT-CIRCUIT SWITCHING DEVICE INCLUDING AT LEAST ONE PYROTECHNIC IGNITION DEVICE

(71) Applicant: SIEMENS ENERGY GLOBAL GMBH & CO. KG, Munich (DE)

(72) Inventors: Frank Schremmer, Fürth (DE); Andreas Zenkner, Veitsbronn (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 500 days.

(21) Appl. No.: 17/800,981

(22) PCT Filed: Feb. 19, 2020

(86) PCT No.: PCT/EP2020/054293
§ 371 (c)(1),
(2) Date: Aug. 19, 2022

(87) PCT Pub. No.: WO2021/164858
PCT Pub. Date: Aug. 26, 2021

(65) Prior Publication Data
US 2023/0070198 A1 Mar. 9, 2023

(51) Int. Cl.
*H01H 39/00* (2006.01)
*H01L 23/525* (2006.01)
(52) U.S. Cl.
CPC ....... *H01H 39/006* (2013.01); *H01L 23/5252* (2013.01)

(58) Field of Classification Search
CPC .................................................. H01L 23/5252
See application file for complete search history.

(56) References Cited

FOREIGN PATENT DOCUMENTS

| DE | 102014207928 A1 | 10/2015 | |
| WO | WO 2013044961 A1 | 4/2013 | |
| WO | WO 2019011717 A1 | 1/2019 | |
| WO | WO-2020030262 A1 * | 2/2020 | ........... H01H 39/004 |

OTHER PUBLICATIONS

English Translation of WO-2020030262 (Year: 2020).*

* cited by examiner

*Primary Examiner* — Benjamin P Sandvik
*Assistant Examiner* — Dmitri Mihaliov
(74) *Attorney, Agent, or Firm* — Laurence A. Greenberg; Werner H. Stemer; Ralph E. Locher (57) ABSTRACT

A short-circuit switching device, in particular a bypass switch, includes a semiconductor element with at least one p-n junction and at least one pyrotechnic ignition device. The semiconductor element is or at least can be in a blocking state prior to the ignition of the pyrotechnic ignition device on the basis of the involvement of the p-n junction. After the ignition of the pyrotechnic ignition device, the semiconductor element is at least partially destroyed, namely at least with respect to the at least one p-n junction, and made at least partially conductive independently of the current flow direction by using explosion gas released by the ignition device after an explosion.

15 Claims, 7 Drawing Sheets

SHORT-CIRCUIT SWITCHING DEVICE INCLUDING AT LEAST ONE PYROTECHNIC IGNITION DEVICE

FIELD AND BACKGROUND OF THE INVENTION

The invention relates to short-circuit switching devices, in particular in the form of bypass switches, to arrangements provided with short-circuit switching devices and to methods for operating short-circuit switching apparatuses.

In power electronics systems, for example converter arrangements, multilevel converters, voltage stabilization devices, reactive power controllers, etc., there is the problem that parts of the systems have to be disconnected as rapidly as possible in some circumstances.

As is known, a mechanically operating pyrotechnic bypass switch can be used to short-circuit components. Such mechanically operating bypass switches have mechanical parts that are moved through pyrotechnic action and switching times of less than one millisecond. Known mechanically operating pyrotechnic bypass switches can withstand short-circuit energies of up to 150 kilojoules in the event of a short-circuit.

SUMMARY OF THE INVENTION

The invention is based on the object of specifying a short-circuit switching device that can operate more rapidly than previous mechanically operating pyrotechnic bypass switches.

This object is achieved according to the invention by way of a short-circuit switching device having the features described below. Advantageous configurations of the short-circuit switching device according to the invention are specified in the dependent claims.

Accordingly, the invention makes provision for the short-circuit switching device to comprise a semiconductor element with at least one p-n junction and at least one pyrotechnic ignition device, wherein the semiconductor element is or at least can be in the blocking state prior to the ignition of the pyrotechnic ignition device on the basis of the involvement of the p-n junction, and wherein, after the ignition of the pyrotechnic ignition device, the semiconductor element is at least partially destroyed, namely at least with respect to the at least one p-n junction, and is made at least partially conductive regardless of the current flow direction by the explosion gas released by the ignition device after an explosion.

A substantial advantage of the short-circuit switching device according to the invention can be considered that of particular short switching times being able to be achieved through the inventive destruction of one or more p-n junctions within a semiconductor element, for example in the microsecond range, because it is possible to dispense with movable mechanical parts. It is also possible to design the short-circuit switching device to be very insensitive with respect to short-circuit energies that arise through appropriate component dimensioning.

In a preferred configuration of the short-circuit switching device, provision is made for the short-circuit switching device to comprise an anode and a cathode, wherein the semiconductor element has a first and a second n-doped semiconductor region, of which the second is connected to the cathode or forms same itself, wherein the semiconductor element has a first and a second p-doped semiconductor region, of which the first is connected to the anode or forms same itself, wherein the first and the second n-doped semiconductor region and the first and second p-doped semiconductor region form at least three p-n junctions electrically in series between the anode and the cathode, namely a first p-n junction between the first p-doped semiconductor region and the first n-doped semiconductor region, a second p-n junction between the first n-doped semiconductor region and the second p-doped semiconductor region, and a third p-n junction between the second p-doped semiconductor region and the second n-doped semiconductor region, and wherein the pyrotechnic ignition device is arranged in such a way that it destroys at least the third p-n junction and as a result makes it conductive regardless of the current flow direction by the explosion gas released by it after an explosion.

The pyrotechnic ignition device is preferably arranged in such a way that it destroys at least the second and third p-n junction and as a result makes them conductive regardless of the current flow direction by the explosion gas (preferably in the form of plasma or ionized gas) released by it after an explosion. In the event of an undamaged p-n junction, the semiconductor element is then unidirectionally conductive, specifically in the current flow direction from the anode in the direction of the cathode, because it will continue to operate as a simple diode on account of the remaining first p-n junction.

With respect to a large cross section (with a diameter of preferably 4 inches or more), high switching currents and nevertheless small construction heights (of for example less than 30 mm), the semiconductor element is preferably a semiconductor wafer with a first wafer side and a second wafer side opposite the first wafer side. The current flow between the anode and the cathode is preferably perpendicular to the plane of the wafer.

The pyrotechnic device preferably has an explosive charge and a gas conduction duct which is arranged in parallel with the plane of the semiconductor wafer and conducts the explosion gas produced by the explosive charge in parallel in the direction of the center of the wafer.

The explosion gas released after an explosion preferably destroys the at least one p-n junction, in particular the third p-n junction, in the region of the center of the wafer and preferably makes it conductive regardless of the current flow direction.

It is particularly advantageous when the explosion gas released after an explosion also destroys the second p-n junction in the region of the center of the wafer and makes it conductive regardless of the current flow direction.

It is also advantageous when the semiconductor element is a semiconductor wafer on the first wafer side of which the first p-doped semiconductor region and the anode are arranged and on the other second wafer side of which the second n-doped semiconductor region and the cathode are arranged.

The short-circuit switching device preferably comprises an electrode which is supported on one of the wafer sides and makes electrical contact with the anode or the cathode.

The gas conduction duct of the pyrotechnic ignition device is preferably formed by a duct-shaped cavity within the electrode, in particular by a small tube arranged within the duct-shaped cavity.

With a view to metal particles or metal ions being able to promote through-contacting or "alloying" or p-n junctions, it is considered to be advantageous when the pyrotechnic device directs the explosion gas released after an explosion toward a metallization applied to the semiconductor element or at least also toward the metallization.

The first and second n-doped semiconductor region and the first and second p-doped semiconductor region preferably form a thyristor in which the second p-doped semiconductor region forms a gate region of the thyristor.

In a preferred configuration, provision is made for the second p-doped semiconductor region to extend in the direction of one of the two wafer sides and to be contacted by a gate electrode applied to said wafer side. The pyrotechnic device preferably directs the explosion gas released after an explosion toward the gate electrode that makes contact with the gate region or at least also toward the gate electrode.

In another preferred configuration, provision is made for the second p-doped semiconductor region to extend to one of the two wafer sides without being contacted with a gate electrode applied to said wafer side. In this last-mentioned variant, the pyrotechnic ignition device preferably directs the explosion gas released after an explosion toward the non-contacted second p-doped semiconductor region.

In yet another preferred configuration, provision is made for the second p-doped semiconductor region to be separated from one of the two wafer sides by the second n-doped semiconductor region and for the cathode to extend in the region on which the explosion gas released by the pyrotechnic ignition device after an explosion acts. In this last-mentioned variant, the pyrotechnic ignition device thus preferably directs the explosion gas released after an explosion toward the second n-doped semiconductor region contacted by the cathode.

The invention furthermore relates to an arrangement, in particular in the form of a converter, a multilevel converter, a voltage stabilization device, a reactive power controller and/or a reactive power compensation system, having at least one module series circuit having at least two submodules connected electrically in series and a control device for actuating the submodules. The invention makes provision for the arrangement to have at least one short-circuit switching device as has been described above.

With respect to the advantages of the arrangement according to the invention and advantageous configurations of the arrangement according to the invention, reference is made to the above statements in connection with the short-circuit switching device according to the invention.

It is advantageous when the at least one short-circuit switching device is a component part of one of the submodules and is connected in parallel with the outer connections of the submodule and can short-circuit same.

The invention furthermore relates to a method for operating a short-circuit switching device, in particular a bypass switch.

Provision is made according to the invention for the short-circuit switching device to comprise a semiconductor element with at least one p-n junction and at least one pyrotechnic ignition device, wherein the semiconductor element is switched to a blocking state prior to the ignition of the pyrotechnic ignition device on the basis of the involvement of the p-n junction, and wherein, through ignition of the pyrotechnic ignition device, the semiconductor element is at least partially destroyed, namely at least with respect to the at least one p-n junction, and is made at least partially conductive regardless of the current flow direction by the explosion gas released by the ignition device after an explosion.

With respect to the advantages of the method according to the invention and advantageous configurations of the method according to the invention, reference is made to the above statements in connection with the short-circuit switching device according to the invention.

The invention is explained in more detail below with reference to exemplary embodiments.

DETAILED DESCRIPTION OF THE INVENTION

For the sake of clarity, the same reference signs are always used for identical or comparable components in the figures.

Figure 1:
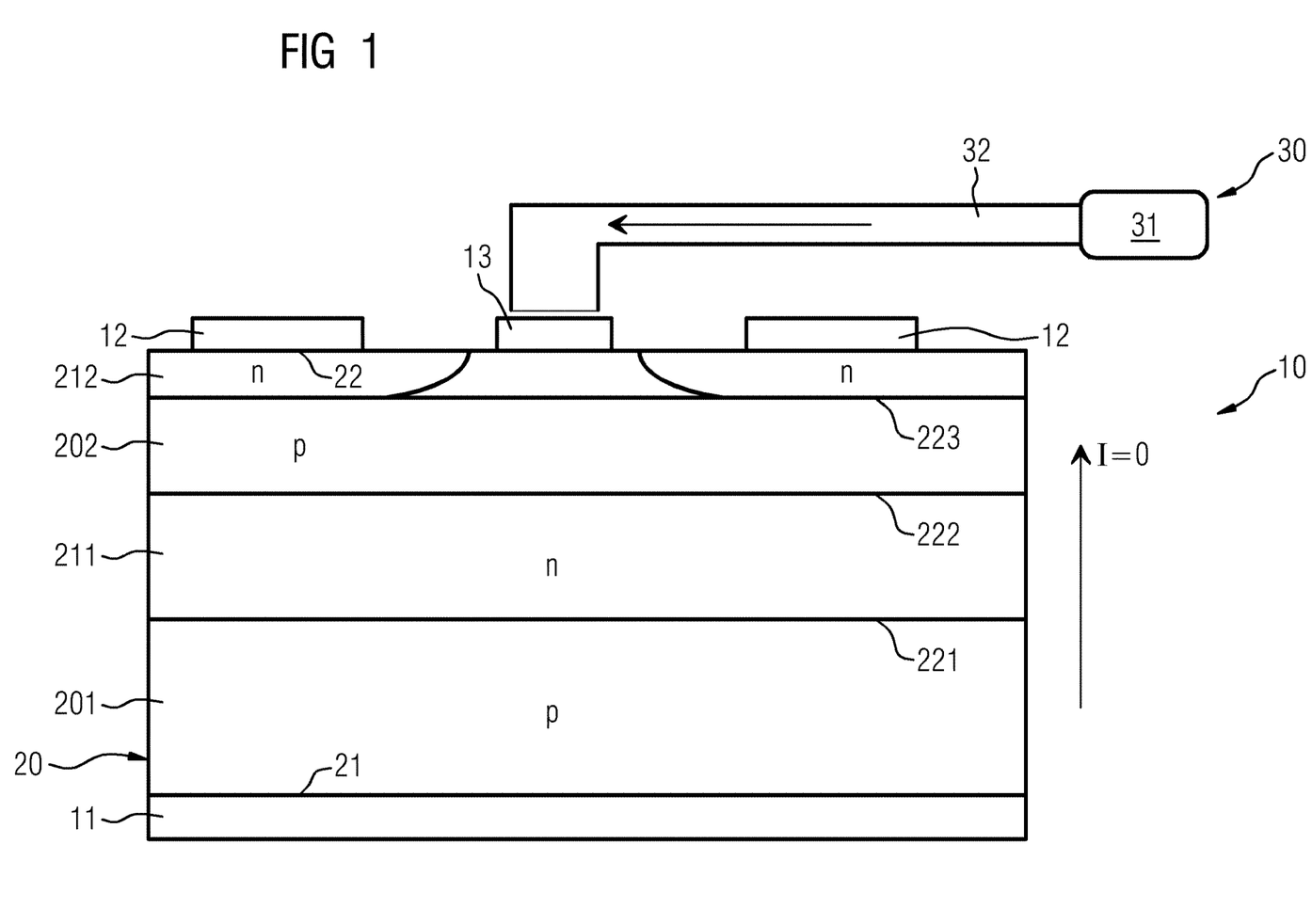
FIG. 1 shows an exemplary embodiment of a short-circuit switching device according to the invention prior to the triggering of an ignition device of the short-circuit switching device.

FIG. 1 shows a first exemplary embodiment of a short-circuit switching device 10 according to the invention. The short-circuit switching device 10 comprises a semiconductor component 20 and a pyrotechnic ignition device 30.

In the exemplary embodiment according to FIG. 1, the semiconductor component 20 is formed by a semiconductor wafer comprising a first wafer side 21, a lower wafer side in FIG. 1, and a second wafer side 22, an upper wafer side in FIG. 1.

The semiconductor component 20 has a first p-doped semiconductor region 201, a second p-doped semiconductor region 202, a first n-doped semiconductor region 211 and a second n-doped semiconductor 212. The four semiconductor regions 201, 202, 211 and 212 form a total of three p-n junctions within the semiconductor component 20, namely a first p-n junction 221 between the first p-doped semiconductor region 201 and the first n-doped semiconductor region 211, a second p-n junction 222 between the first n-doped semiconductor region 211 and the second p-doped semiconductor region 202, and a third p-n junction 223 between the second p-doped semiconductor region 202 and the second n-doped semiconductor region 212.

The four semiconductor regions or the three p-n junctions form a thyristor in which the first p-doped semiconductor region 201 is contacted by an anode 11, the second n-doped semiconductor region 212 is contacted by a cathode 12, and the second p-doped semiconductor region 202 is contacted by a gate electrode 13.

In the exemplary embodiment according to FIG. 1, the pyrotechnic ignition device 30 comprises an explosive charge 31 that is connected to the center of the wafer on the second wafer side 22 of the semiconductor component 20 via a gas conduction duct 32. One end of the gas conduction duct 32 is directed toward the gate electrode 13 and carries an explosion gas G, produced by the explosive charge 31 in the event of the explosive charge 31 being triggered, to the gate electrode 13 or to the center of the wafer of the semiconductor component 20.

The semiconductor component 20, the anode 11, the cathode 12 and the gate electrode 13 may be formed by a conventional or commercially available thyristor, as is generally known and is used in the field of converter technology, for example. In contrast to a conventional wiring of the thyristor, the exemplary embodiment of FIG. 1 lacks an electrical contact-connection of the gate electrode 13 since the ignition of the thyristor is not caused electrically but pyrotechnically, for which reason the gate electrode 13 is connected only to the gas conduction duct 32 and the explosive charge 31.

Prior to an ignition of the explosive charge 31, the short-circuit switching device 10 is in an electrical blocking state or is without current because no current I can flow between the anode 11 and the cathode 12 in the absence of an ignition current between the second p-doped semiconductor region 202 and the second n-doped semiconductor region 212.

Figure 2:
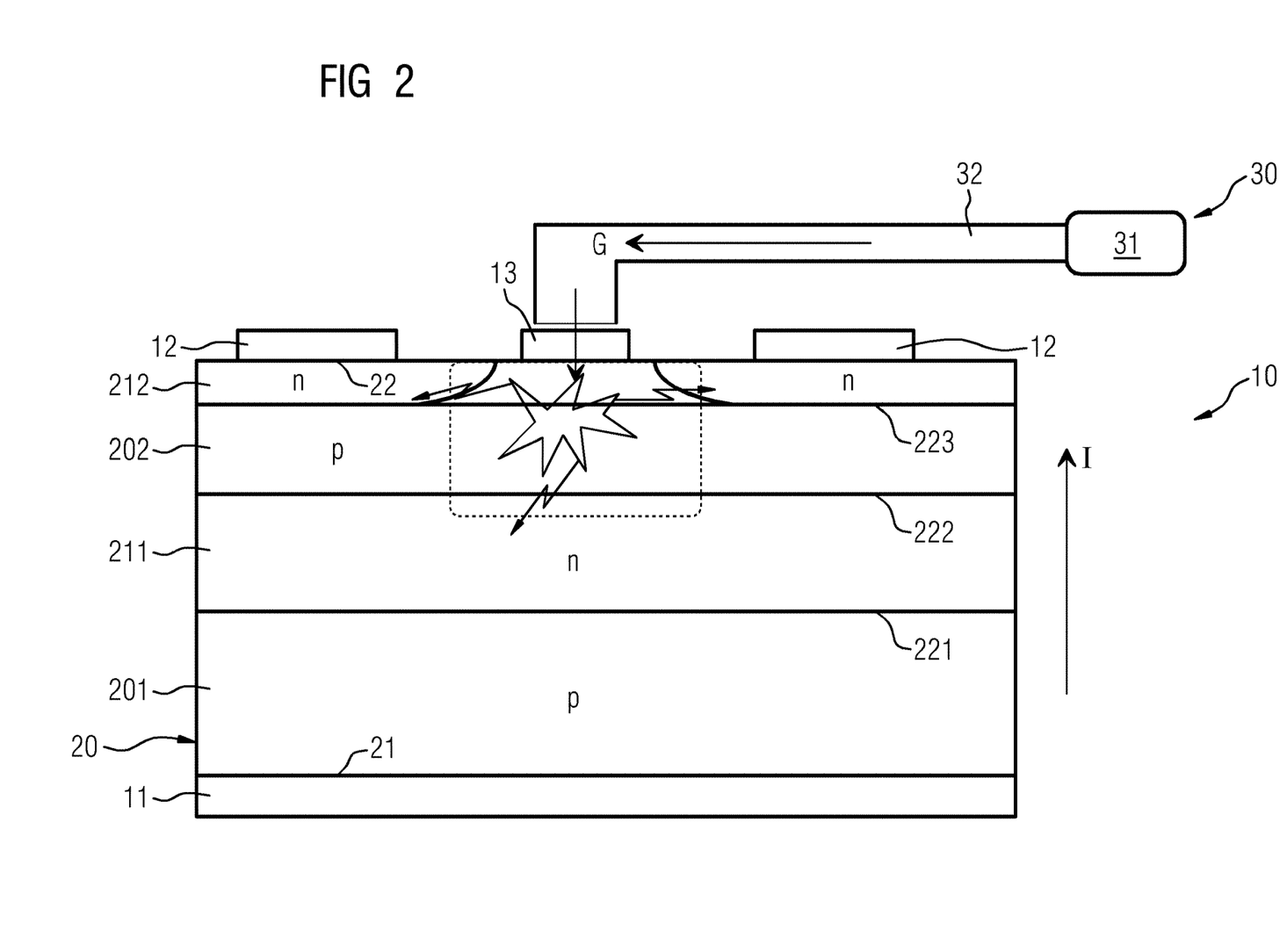
FIG. 2 shows the short-circuit switching device according to FIG. 1 after the triggering of the ignition device.

FIG. 2 shows the short-circuit switching device 10 according to FIG. 1 after ignition of the explosive charge 31. It can be seen that the explosion gas G has an effect on the gate electrode 13 and has at least locally destroyed said gate electrode, the second p-n junction 222 and the third p-n junction 223, with the result that the two p-n junctions 222 and 223 are made conductive regardless of the current flow direction—at least in their destroyed regions.

Through the destruction of the semiconductor structure on account of the effect of the explosion gas G, only one single functional p-n junction remains in the semiconductor component 20, namely the first p-n junction 221 between the first p-doped semiconductor region 201 and the first n-doped semiconductor region 211. In other words, electrically only one p-n diode remains, which between the anode 11 and the cathode 12 is conductive along the current flow direction I shown in FIG. 2. The short-circuit switching device 10 is thus unidirectionally conductive or connected through since the former transistor has been replaced with a simple p-n diode.

Figure 3:
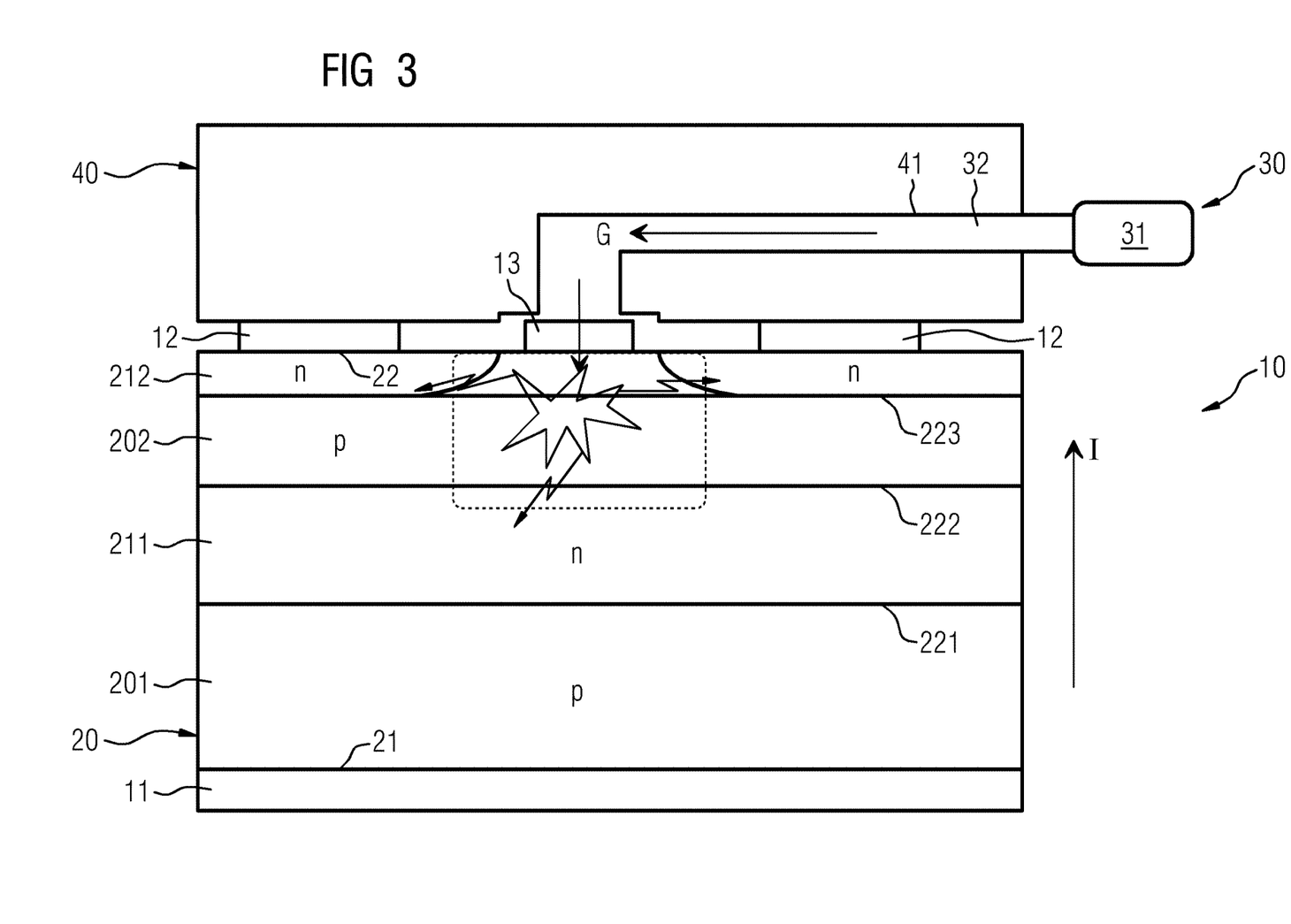
FIG. 3 shows an exemplary embodiment of a short-circuit switching device according to the invention in which a gas conduction duct is formed by a duct-shaped cavity in an electrode.

FIG. 3 shows a second exemplary embodiment of a short-circuit switching device 10 according to the invention. In the short-circuit switching device 10 according to FIG. 3, the gas conduction duct 32 of the pyrotechnic ignition device 30 is formed by a duct-shaped cavity 41 within an electrode placed onto the cathode 12. The electrode 40 thus has a double function: on the one hand, it permits simple, whole-area contacting of the cathode 12 and, on the other hand, it enables the explosion gas G to be passed on easily from the explosive charge 31 in the direction toward the gate electrode 13.

Other than that, the above statements in connection with FIGS. 1 and 2 apply accordingly in the exemplary embodiment according to FIG. 3.

Figure 4:
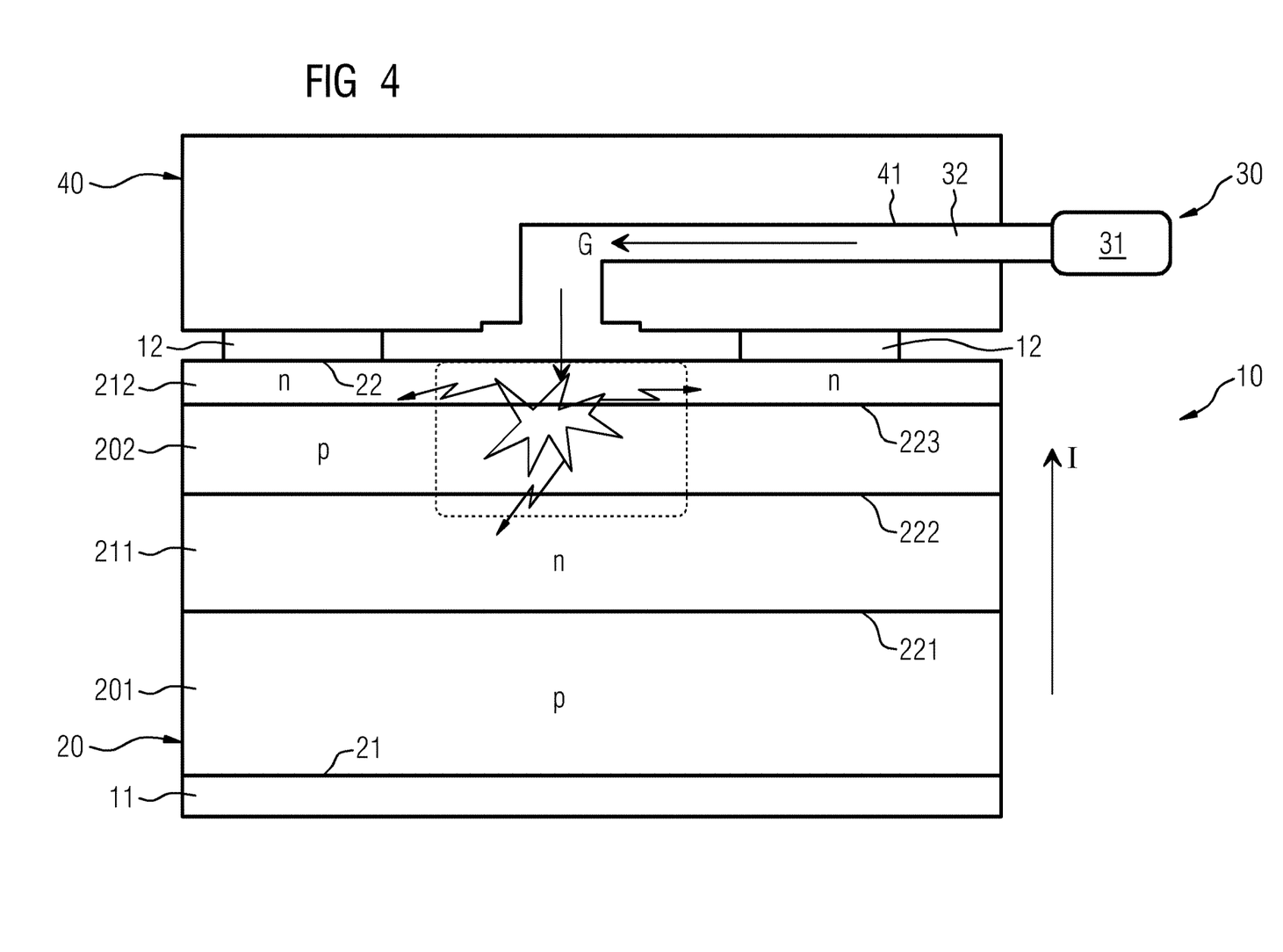
FIG. 4 shows an exemplary embodiment of a short-circuit switching device according to the invention without a gate electrode.

FIG. 4 shows a third exemplary embodiment of a short-circuit switching device 10 according to the invention. In the short-circuit switching device 10 according to FIG. 4, the gate electrode 13 is omitted since an electrical contacting of the second p-doped semiconductor region 202 is not absolutely necessary for the functioning of the short-circuit switching device 10. During the production of the short-circuit switching device 10 according to FIG. 4, the application of the gate electrode 13 is thus omitted.

Furthermore, in the exemplary embodiment according to FIG. 4, the second p-doped semiconductor region 202 is separated from the second wafer side 22 by the second n-doped semiconductor region 212; this is possible since the gate electrode 13 are the gate connection is simply not there.

In the exemplary embodiment according to FIG. 4, the explosion gas G of the explosive charge 31 is directed directly to the second p-doped semiconductor region 202, as a result of which—as explained in connection with FIGS. 1 to 3—at least the second p-n junction 222 and the third p-n junction 223 are destroyed. Through the destruction of the two p-n junctions 222 and 223, the thyristor structure of the semiconductor component 20 results in a simple diode structure that is conductive in the current flow direction from the anode 11 to the cathode 12.

Figure 5:
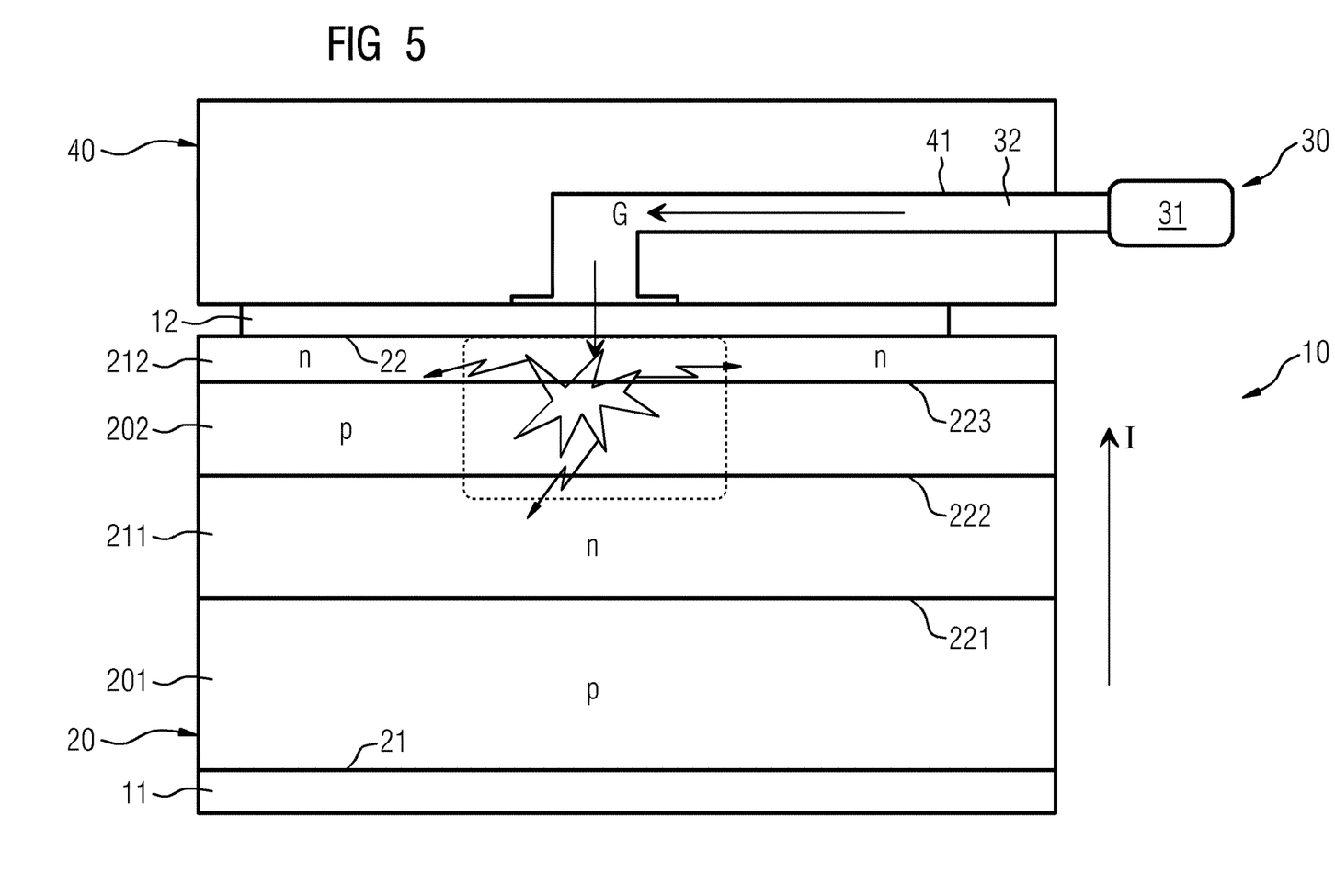
FIG. 5 shows an exemplary embodiment of a short-circuit switching device according to the invention with a continuous cathode.

FIG. 5 shows a fourth exemplary embodiment of a short-circuit switching device 10 according to the invention. In the exemplary embodiment according to FIG. 5, the cathode 12 extends over the entire second wafer side 22 of the semiconductor component 20. As in the exemplary embodiment according to FIG. 4, there is no gate electrode 13.

Furthermore, in the exemplary embodiment according to FIG. 5, the second p-doped semiconductor region 202 is separated from the second wafer side 22 by the second n-doped semiconductor region 212, as is also the case in the exemplary embodiment according to FIG. 4.

Other than that, the above statements in connection with the first three exemplary embodiments according to FIGS. 1 to 4 apply accordingly in the fourth exemplary embodiment according to FIG. 5.

Figure 6:
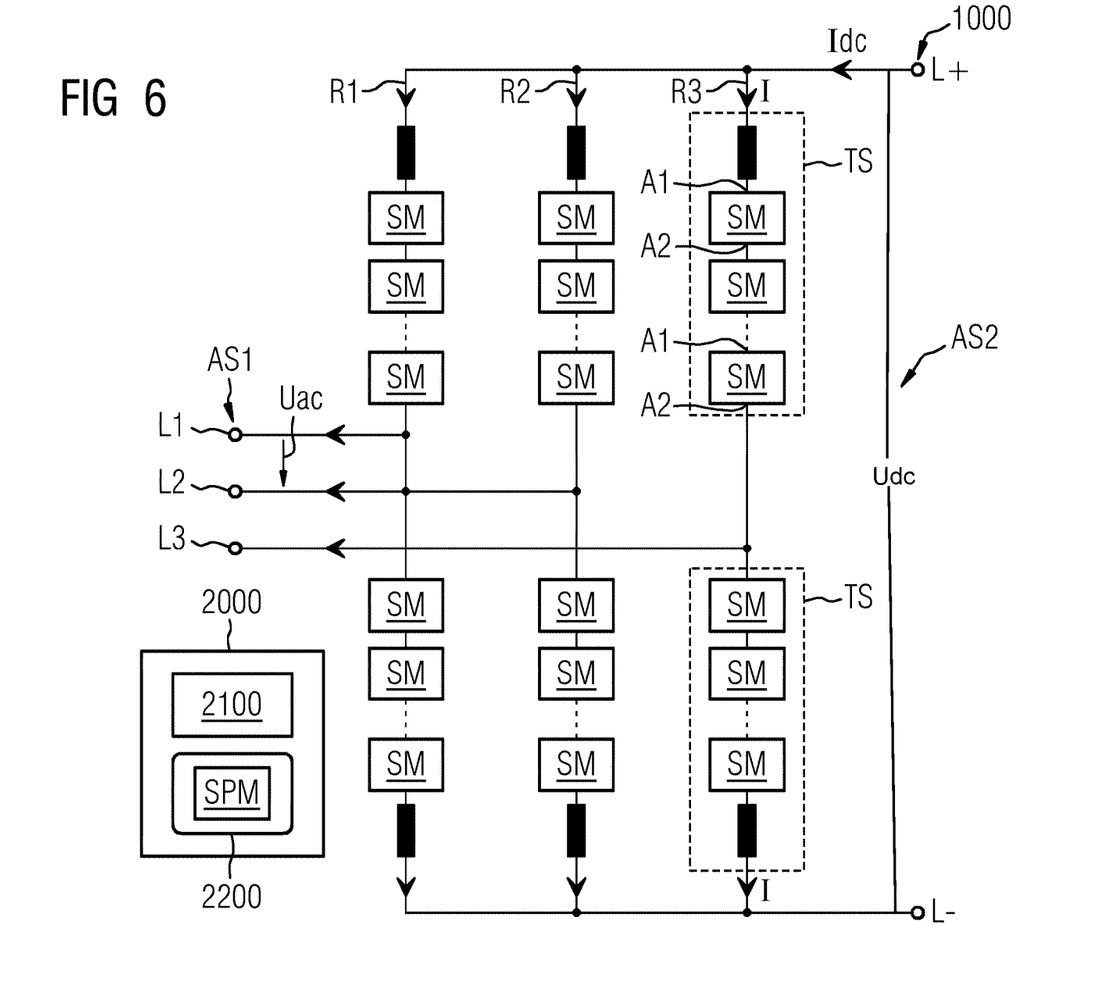
FIG. 6 shows an exemplary embodiment of a converter according to the invention provided with short-circuit switching devices.

FIG. 6 shows an exemplary embodiment of an electrical arrangement in the form of a converter 1000, for example a multilevel converter shown, which is provided with short-circuit switching devices 10, as have been explained above. The first connection side AS1 of the converter 1000 has three AC voltage connections L1, L2 and L3 at each of which an alternating current can be fed into the converter 1000 or at which an alternating current can be drawn there from. On a second connection side AS2 there are two DC voltage connections at which a direct current Idc can be fed into the converter 1000 or can be drawn therefrom; these are denoted in FIG. 6 with the reference signs L+ and L−.

The DC voltage between the DC voltage connections L+ and L− has the reference sign Udc. The respective AC voltage applied between the AC voltage connections L1, L2 and L3 has the reference sign Uac.

The converter 1000 has three series circuits R1, R2 and R3 whose outer connections from the DC voltage connections L+ and L− of the converter 1000. The series circuits R1, R2 and R3 each comprise two series-connected module series circuits TS.

Each of the module series circuits TS has in each case at least two series-connected submodules SM that each comprise at least two switching elements and a capacitor. Exemplary embodiments for suitable submodules SM are explained below by way of example in connection with FIGS. 7 and 8.

The converter 1000 has a control device 2000 that is suitable for actuating the submodules SM and thus for actuating the module series circuits TS. For this purpose, the control device 2000 has a computation device 2100 and a memory 2200. A control program module SPM that determines the mode of operation of the computation device 2100 is stored in the memory 2200.

Figure 7:
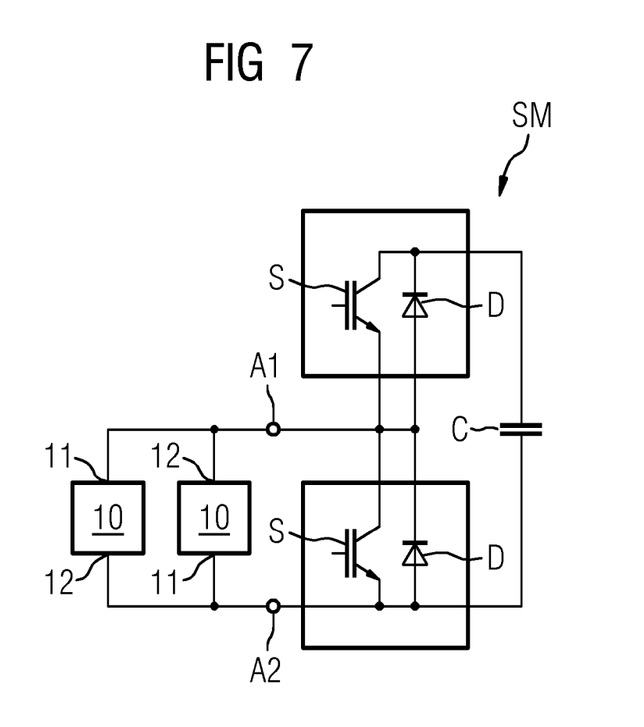
FIG. 7 shows an exemplary embodiment of a submodule that can be used to form module series circuits in the converter according to FIG. 6.

FIG. 7 shows an exemplary embodiment of a submodule SM comprising two switching elements S in the form of transistors, a diode D being connected in parallel (or antiparallel) with each of said switching elements, and a capacitor C as energy store. Said components form a half-bridge circuit that makes it possible to operate the capacitor C in only or exclusively a unipolar manner through actuating the switching elements S—by the control device 2000 according to FIG. 6.

The transistors and the respective parallel-connected diodes D may be prefabricated components, as is indicated graphically in the figures by boxes; the transistors and the respective parallel-connected diodes D may be IGBT components, for example.

Two short-circuit switching devices 10 are connected in parallel with the two connections A1 and A2, specifically with a different polarity; FIG. 7 thus shows that the connections A1 and A2 are each connected to the anode 11 of one short-circuit switching device and to the cathode 12 of the other short-circuit switching device 10. The short-circuit switching devices 10 are preferably those as have been described above in connection with FIGS. 1 to 5. The antiparallel connection of the two short-circuit switching devices 10 makes a bidirectional short-circuit possible because at least one of the two short-circuit switching devices 10 is conductive after pyrotechnic ignition on account of the first p-n junction 221 that is polarized in the flow direction.

Figure 8:
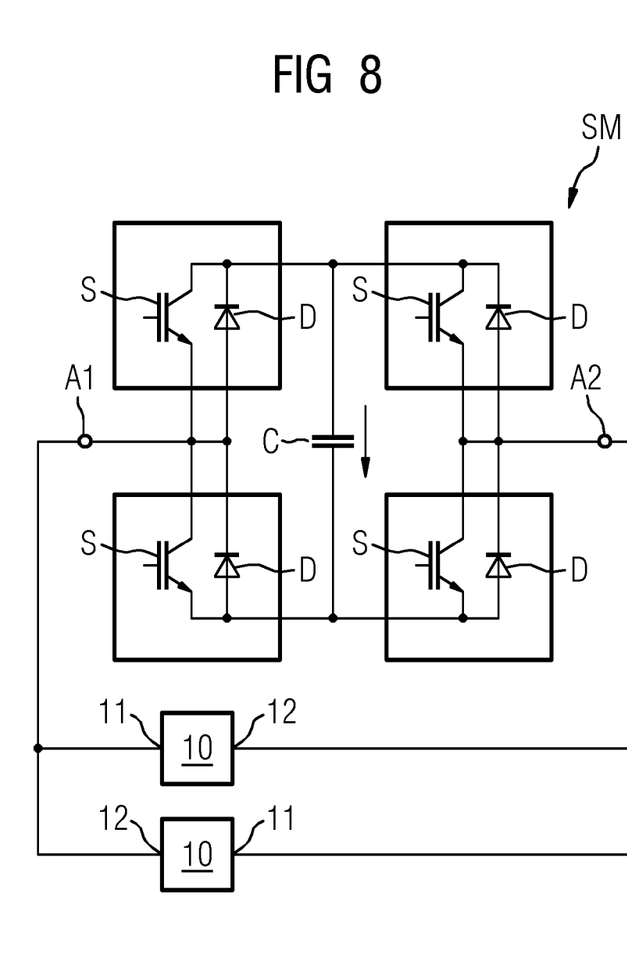
FIG. 8 shows another exemplary embodiment of a submodule that can be used to form module series circuits in the converter according to FIG. 6.

FIG. 8 shows an exemplary embodiment of a submodule SM comprising four switching elements S the form of transistors, a diode being connected in parallel with each of said switching elements, and a capacitor C as energy store. Said components form a full-bridge circuit that makes it possible to operate the capacitor C in a bipolar manner through actuating the switching elements S—by the control device 2000 according to FIG. 6. Two short-circuit switching devices 10 (in antiparallel with one another) are again connected in parallel with the two connections A1 and A2, preferably those that have been described above in connection with FIGS. 1 to 5.

Although the invention has been described and illustrated in more detail through preferred exemplary embodiments, the invention is not restricted by the disclosed examples, and other variations may be derived therefrom by a person skilled in the art without departing from the scope of protection of the invention.

The invention claimed is:

1. A short-circuit switching device or bypass switch, comprising:
    a semiconductor element having at least one p-n junction; and
    at least one pyrotechnic ignition device;
    said semiconductor element being in a blocking state or at least being configured to be in a blocking state, prior to an ignition of said pyrotechnic ignition device based on an involvement of said p-n junction; and
    said semiconductor element being at least partially destroyed, at least with respect to said at least one p-n junction, after the ignition of said pyrotechnic ignition device, and said semiconductor element being made at least partially conductive regardless of a current flow direction, due to explosion gas released by said ignition device after an explosion.

2. The short-circuit switching device according to claim 1, which further comprises:
    an anode and a cathode;
    said semiconductor element having first and second n-doped semiconductor regions, said second n-doped semiconductor region being connected to said cathode or forming said cathode;
    said semiconductor element having first and second p-doped semiconductor regions, said first p-doped semiconductor region being connected to said anode or forming said anode;
    said first and second n-doped semiconductor regions and said first and second p-doped semiconductor regions forming at least three p-n junctions electrically in series between said anode and said cathode;
    said p-n junctions including a first p-n junction between said first p-doped semiconductor region and said first n-doped semiconductor region, a second p-n junction between said first n-doped semiconductor region and said second p-doped semiconductor region, and a third p-n junction between said second p-doped semiconductor region and said second n-doped semiconductor region; and
    said pyrotechnic ignition device being disposed to destroy at least said third p-n junction resulting in making at least said third p-n junction conductive regardless of the current flow direction, due to the explosion gas released by said pyrotechnic ignition device after an explosion.

3. The short-circuit switching device according to claim 2, wherein said pyrotechnic ignition device is disposed to destroy at least said second and third p-n junctions resulting in making at least said second and third p-n junctions conductive regardless of the current flow direction, due to the explosion gas released by said pyrotechnic ignition device after an explosion.

4. The short-circuit switching device according to claim 1, wherein said semiconductor element is a semiconductor wafer having a first wafer side and a second wafer side opposite to said first wafer side.

5. The short-circuit switching device according to claim 4, wherein:
    said pyrotechnic ignition device has an explosive charge and a gas conduction duct disposed in parallel with a plane of said semiconductor wafer, said gas conduction duct conducting the explosion gas produced by said explosive charge in parallel in a direction of a center of said wafer; and
    the explosion gas released after an explosion destroys at least said third p-n junction in a region of said center of said wafer and makes at least said third p-n junction conductive regardless of the current flow direction.

6. The short-circuit switching device according to claim 5, wherein the explosion gas released after an explosion also destroys said second p-n junction in said region of said center of said wafer and makes said second p-n junction conductive regardless of the current flow direction.

7. The short-circuit switching device according to claim 1, wherein said semiconductor element is a semiconductor wafer having:
    a first wafer side on which said first p-doped semiconductor region and said anode are disposed, and
    a second wafer side on which said second n-doped semiconductor region and said cathode are disposed.

8. The short-circuit switching device according to claim 7, which further comprise:
    an electrode supported on one of said wafer sides and making electrical contact with said anode or said cathode;

said gas conduction duct of said pyrotechnic ignition device being formed by a duct-shaped cavity within said electrode or by a tube disposed within said duct-shaped cavity.

9. The short-circuit switching device according to claim 1, wherein said pyrotechnic ignition device directs the explosion gas released after an explosion toward a metallization applied to said semiconductor element or at least toward said metallization.

10. The short-circuit switching device according to claim 1, wherein said first and second n-doped semiconductor regions and said first and second p-doped semiconductor regions form a thyristor in which said second p-doped semiconductor region forms a gate region of said thyristor.

11. The short-circuit switching device according to claim 4, wherein said second p-doped semiconductor region extends in a direction of one of said two wafer sides and is contacted by a gate electrode applied to said wafer side.

12. The short-circuit switching device according to claim 10, wherein said pyrotechnic ignition device directs the explosion gas released after an explosion toward a gate electrode making contact with said gate region or at least toward said gate electrode.

13. An arrangement being at least one of a converter, a multilevel converter, a voltage stabilization device, a reactive power controller or a reactive power compensation system, the arrangement comprising:
    at least one module series circuit having at least two submodules connected electrically in series;
    a control device for actuating said submodules; and
    at least one short-circuit switching device according to claim 1.

14. The arrangement according to claim 13, wherein said submodules have outer connections, said at least one short-circuit switching device is a component part of one of said submodules, is connected in parallel with said outer connections and can short-circuit said outer connections.

15. A method for operating a short-circuit switching device or bypass switch, the method comprising:
    providing the short-circuit switching device with a semiconductor element having at least one p-n junction, and providing the short-circuit switching device with at least one pyrotechnic ignition device;
    switching the semiconductor element to a blocking state prior to an ignition of the pyrotechnic ignition device based of an involvement of the at least one p-n junction; and
    at least partially destroying the semiconductor element, at least with respect to the at least one p-n junction, by ignition of the pyrotechnic ignition device, and making the semiconductor element at least partially conductive regardless of a current flow direction by using explosion gas released by the ignition device after an explosion.

\* \* \* \* \*